(12) United States Patent
Kim et al.

(10) Patent No.: US 7,125,797 B2
(45) Date of Patent: Oct. 24, 2006

(54) CONTACT STRUCTURE OF SEMICONDUCTOR DEVICE AND METHOD OF FORMING THE SAME

(75) Inventors: Jun-young Kim, Gyeonggi-do (KR); Byoung-lyong Choi, Seoul (KR); Eun-kyung Lee, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 52 days.

(21) Appl. No.: 10/915,538

(22) Filed: Aug. 11, 2004

(65) Prior Publication Data
US 2005/0074969 A1 Apr. 7, 2005

(30) Foreign Application Priority Data
Oct. 1, 2003 (KR) .................. 10-2003-0068332

(51) Int. Cl.
*H01L 21/44* (2006.01)

(52) U.S. Cl. .................. 438/658; 438/669; 257/344
(58) Field of Classification Search ................. 257/344, 257/401, 406, 408; 438/658, 667, 669
See application file for complete search history.

(56) References Cited

U.S. PATENT DOCUMENTS

| 5,599,464 A * | 2/1997 | Laird et al. ..................... 216/2 |
| 6,057,191 A * | 5/2000 | Moroni ....................... 438/257 |
| 6,162,679 A * | 12/2000 | Lin ............................. 438/253 |
| 6,169,315 B1 * | 1/2001 | Son ............................ 257/408 |

* cited by examiner

*Primary Examiner*—Phuc T. Dang
(74) *Attorney, Agent, or Firm*—Buchanan Ingersoll PC

(57) ABSTRACT

A contact structure of a semiconductor includes a substrate, a conductive doping layer having an opposite polarity to that of the substrate, the conductive doping layer being formed in the substrate, a conductive layer formed on the conductive doping layer, and an insulation doping layer formed under the conductive doping layer in the substrate.

14 Claims, 6 Drawing Sheets
(1 of 6 Drawing Sheet(s) Filed in Color)

CONTACT STRUCTURE OF SEMICONDUCTOR DEVICE AND METHOD OF FORMING THE SAME

BACKGROUND OF THE INVENTION

This application claims the priority of Korean Patent Application No. 2003-68332, filed on Oct. 1, 2003, in the Korean Intellectual Property Office, the disclosure of which is incorporated herein in its entirety by reference.

1. Field of the Invention

The present invention relates to a contact structure of a semiconductor, and more particularly, to a contact structure of a semiconductor, which provides insulation between upper and lower plates and does not affect electrical conduction in a horizontal direction by forming an insulation doping layer under a conductive layer functioning as wiring of an ultra-shallow p-n junction. The present invention further relates to a method of forming such a contact structure of a semiconductor device.

2. Description of the Related Art

With high density and high integration of a semiconductor device, a contact less than 1 µm has been required. The reduction of a device from a macro size to a micro size is difficult due to newly considerable, unexpected problems. Particularly, the reliability of a minute size contact structure is a primary factor determining performance and life of the semiconductor device.

Semiconductor devices are generally used in a state where they are interconnected on a substrate, being supplied with electric power through a high conductive contact. For example, when an electric signal or electric power is applied to a terminal of a bipolar or MOS transistor, a semiconductor terminal contacts a high electrical conductor to allow for the current flow. At this point, no voltage-drop/contact-resistance must be incurred at the contact portion. Even when there is a resistance component when polarity in opposite directions is changed, resistance must be a little.

FIG. 1 is a schematic view of a conventional contact structure of a semiconductor device.

Referring to FIG. 1, a silicon oxide ($SiO_2$) layer is formed on a silicon substrate 11. A predetermined region of the silicon substrate 11 is exposed by removing a predetermined pattern of the silicon oxide layer through, for example, an etching process. A conductive doping layer 13 doped with conductivity-forming material such as boron (B) or phosphorus (P) is formed in the silicon substrate through the exposed region of the silicon substrate 11. A conductive layer 14 is formed on the conductive doping layer 13. The conductive layer 14 is formed of, for example, aluminum (Al) widely used for a contact of the silicon substrate.

When the aluminum is used as resistant contact metal of silicon semiconductor, a sintering process is performed to increase density and improve a contact property. However, at this point, the silicon may migrate to an aluminum layer, making it difficult to form a proper metal contact. To solve this problem, 1–2% of an alloy element is added to the aluminum to form minute silicon extraction in a basic structure of the aluminum. In addition, barrier metal such as TiN, TiW and the like is used to reduce the migration to the device. A short circuit of the device may be incurred due to a deep spike phenomenon caused by defect of the oxide layer formed around a metal contact surface.

Particularly, when an ultra-shallow junction is formed, since a self-diffusion phenomenon is incurred by silicon nodule caused by the silicon extraction and vacancy, a very good quality oxide layer must be formed to prevent the short circuit.

SUMMARY OF THE INVENTION

The present invention provides a contact structure of a semiconductor device, which can electrically stabilize the semiconductor device, thereby improving the reliability of the device.

Also, the present invention provides a contact structure that can be applied to a variety of semiconductor devices including a p-n junction.

According to an aspect of the present invention, there is provided a contact structure of a semiconductor, comprising a substrate; a conductive doping layer having an opposite polarity to that of the substrate, the conductive doping layer being formed in the substrate; a conductive layer formed on the conductive doping layer; and an insulation doping layer formed under the conductive doping layer in the substrate.

The substrate and the conductive doping layer form a p-n junction, and the insulation doping layer is formed of oxygen or nitrogen.

The contact structure may further comprise an insulating layer formed on a portion of the substrate, on which the conductive layer is not formed.

The conductive layer is formed of metal and the conductive doping layer is formed of conductivity-forming material.

According to another aspect of the present invention, there is provided a method of making a contact structure of a semiconductor device, comprising forming an insulating layer on a substrate and removing a portion of the insulating layer to expose a portion of the substrate; forming a conductive doping layer and an insulation doping layer in the substrate through the exposed portion of the substrate, the insulation doping layer being formed under the conductive doping layer; and forming a conductive layer on the conductive doping layer.

The forming the insulating layer comprises forming an oxide layer on the substrate; light-exposing and developing the oxide layer after disposing a mask above the oxide layer; and etching a portion of the oxide layer to expose the portion of the substrate.

The forming the conductive layer comprises depositing the conductive layer on the insulating layer and the exposed portion of the substrate; light-exposing and developing the conductive layer after disposing a mask above the conductive layer; and etching a portion of the conductive layer.

BRIEF DESCRIPTION OF THE DRAWINGS

The application file contains at least one drawing executed in color. Copies of this patent application with color drawings are enclosed.

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
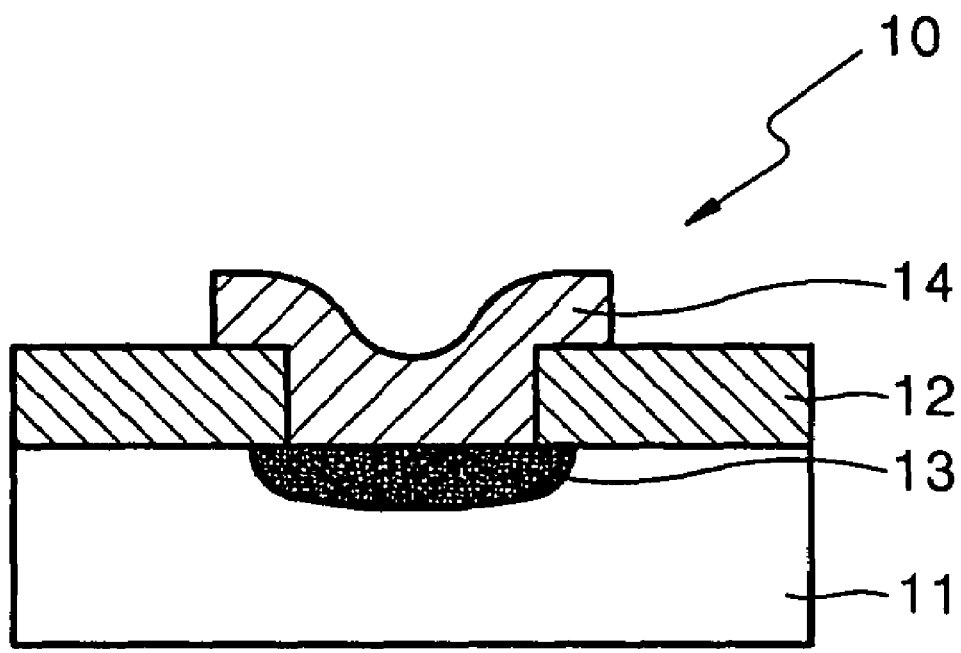
FIG. 1 is a view of a conventional contact structure of a semiconductor device.
Figure 2A:
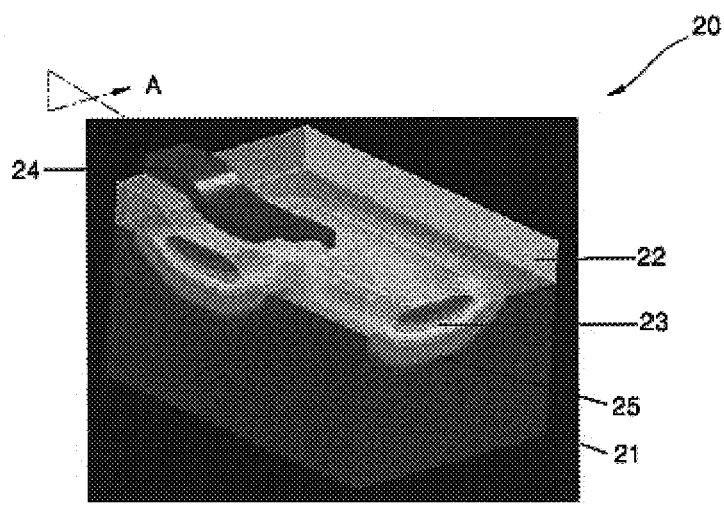
FIG. 2A is a perspective view of a contact structure of a semiconductor device according to an embodiment of the present invention.
Figure 2B:
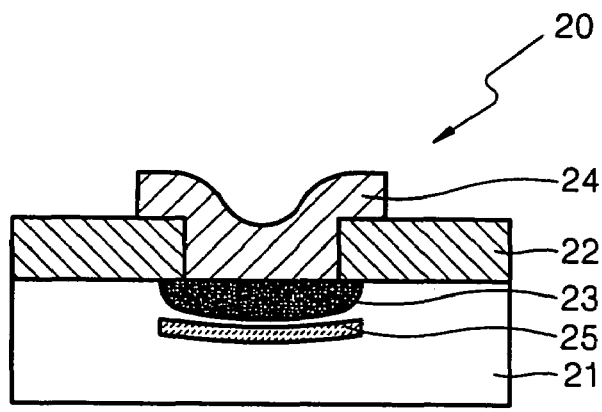
FIG. 2B is a sectional view taken along line A–A' of FIG. 2A.

FIG. 2A is a perspective view of a contact structure of a semiconductor device according to an embodiment of the present invention, and FIG. 2B is a sectional view taken along line A–A' of FIG. 2A.

Referring to FIGS. 2A and 2B, an insulating layer 22 is formed on a substrate 21, exposing a predetermined region of the substrate 21. A conductive layer 24 is formed on the exposed region of the substrate 21. A conductive doping layer 23 is formed in the substrate 21 by diffusing or implanting conductivity-forming material (dopant, impurity) through the exposed region of the substrate 21, corresponding to the conductive layer 24. An insulation doping layer 25 for providing insulation to the substrate 21 is formed under the conductive doping layer 23 in the substrate 21 by implanting insulation-forming material.

The substrate 21 is formed of material such as Si, SiC and GaN. However, the present invention is not limited to this case. The insulating layer 22 may be formed of an oxide layer having an electrical insulation property. The conductive layer 24 is formed of high-conductivity material that can function as an electrode for the semiconductor device.

The material for forming the conductive doping layer 23 may be material having conductivity itself or material giving the conductivity to the doping region of the substrate 21 by being diffused or implanted in the substrate 21. When the substrate is formed of Si, the material for forming the conductive doping layer 23 may be boron (B) or phosphorus (P). However, since the conducting property of the substrate 21 may be varied according to density of the doping material, a variety of doping materials can be selectively used. The insulation forming material (dopant, impurity) for forming the insulation doping layer 25 is material such as oxygen or nitrogen providing the insulation to the substrate 21. The insulating property of the substrate 21 may be varied according to density of the doping material.

A method for forming the contacting structure according to an embodiment of the present invention will be described hereinafter with reference to accompanying drawings.

FIGS. 3A through 3F are sectional views illustrating consecutive processes of forming the contact structure according to an embodiment of the present invention.

Figure 3A:
FIGS. 3A through 3F are sectional views illustrating a method of forming a contact structure according to an embodiment of the present invention.
Figure 3B:
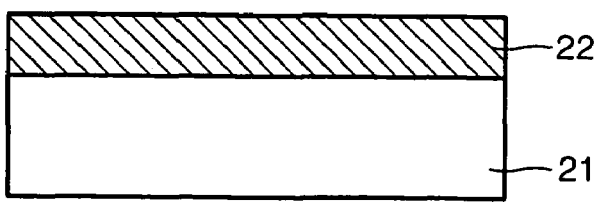

Referring first to FIG. 3A, the substrate 21 is first prepared. The substrate 21 is formed of Si, SiC, or GaN. However, the present invention is not limited to this case. In this embodiment, the substrate 21 is formed of Si. As shown in FIG. 3B, a surface of the substrate 21 is oxidized to define the insulating layer 22. That is, the oxidized surface of the substrate 21 becomes the insulating layer 22.

Figure 3C:
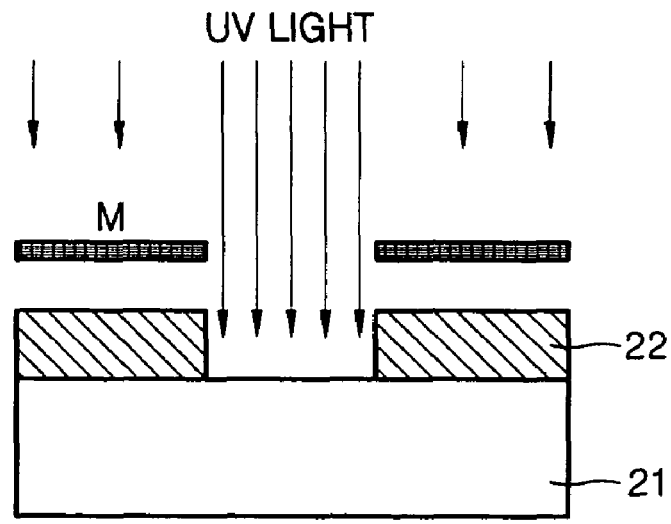

As shown in FIG. 3C, a predetermined region of the insulating layer 22 is removed through an etching process. That is, ultraviolet light is eradiated to the insulating layer 22 with a mask M located above the insulating layer 22, and a portion of the insulating layer 22, which is exposed to the ultraviolet light, is removed through the etching process. As a result, a region of the silicon substrate 21, on which the conductive layer 24 will be deposited, is exposed.

Figure 3D:
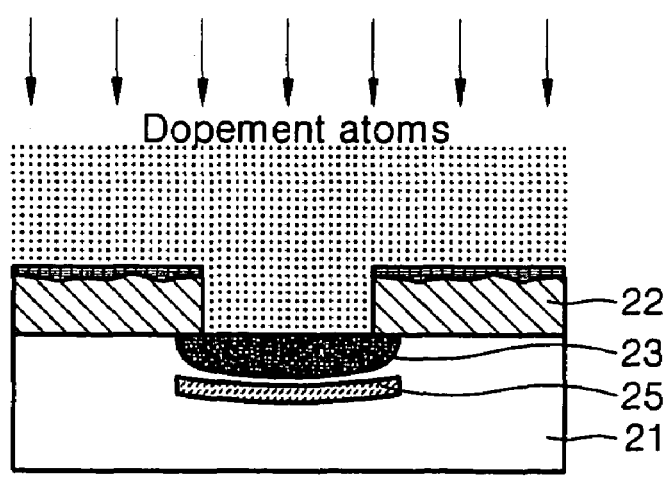

As shown in FIG. 3D, the conductivity-forming material is diffused or implanted into the silicon substrate 21 through the exposed region of the silicon substrate 21. The conductivity-forming material does not have conductivity itself but gives the conductivity to the doping region of the substrate 21 by being diffused or implanted in the silicon substrate 21. Since the substrate 21 is formed of Si, boron (B) or phosphorus (P) is preferably used as the conductivity-forming material. Insulation-forming material such as oxygen and nitrogen is implanted into the silicon substrate 21 to form the insulation doping layer 25 under the conductive doping layer 23 in the substrate 21. That is, the insulation doping layer 25 can be formed under the conductive doping layer 23 by controlling doping energy when the insulation-forming material is diffused or implanted into the silicon substrate 21.

The process order of the implantation process for the insulation-forming material and the implantation process for the conductivity-forming material may be altered. That is, after the insulation doping layer 25 is formed by doping the insulation-forming material in a predetermined depth of the substrate 21 with the control of ion doping energy, the conductive doping layer 23 is formed by diffusing or implanting the conductivity-forming material above the insulation doping layer 25 in the substrate 21.

Figure 3E:
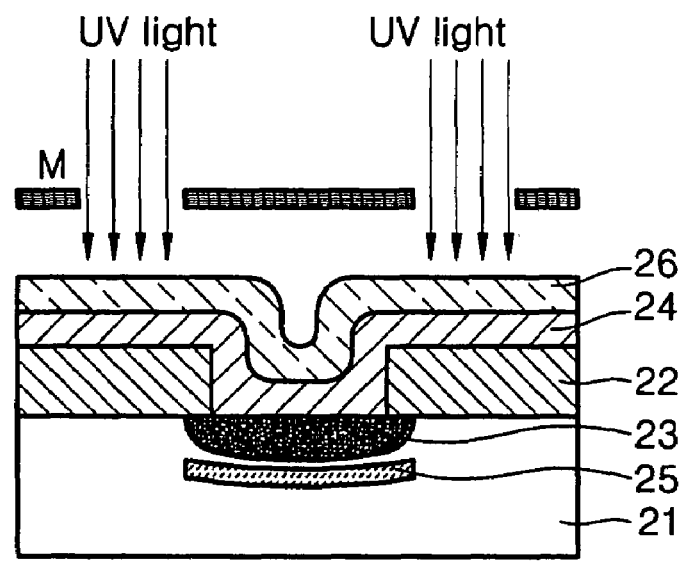

As shown in FIG. 3E, the conductive material is deposited on the insulating layer 22 and the exposed region of the substrate 21. The conductive material has conductivity enough to form an electrode. Metal is generally used as the conductive material. Particularly, when the substrate 21 is formed of silicon, aluminum is used as the conductive material. After the conductive material is deposited, photoresistor layer is deposited on the conductive material. Ultraviolet ray is emitted to the photoresistor layer 26 in a state where a mask is disposed above the photoresistor layer 26, after which the etching process is performed to form the conductive layer 24 having a predetermined pattern.

Figure 3F:
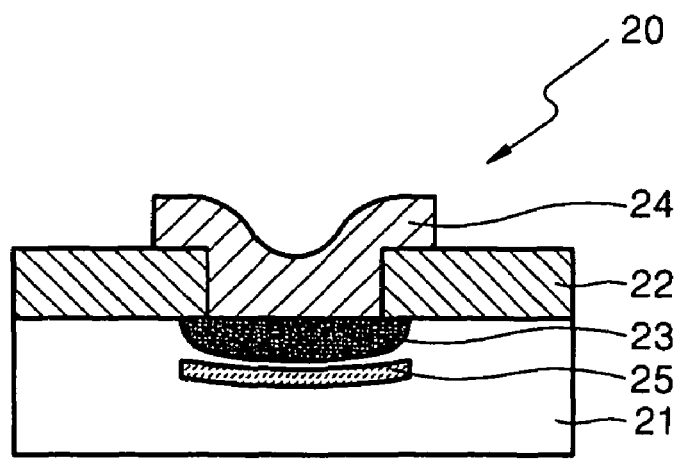

By the above-described processes, the inventive contact structure depicted in FIGS. 2B and 3F can be obtained. That is, as shown in FIGS. 2B and 3F, since the insulation doping layer 25 is formed under the conductive doping layer 23 in the substrate 21, the current flow is cut off in a vertical direction in the drawing. When the conductive doping layer 23 is formed by implanting the conductivity-forming material, a heat-treating process is further performed to activate the conductive doping layer 23.

The above-described contact structure of the present invention can be applied to a variety of semiconductor devices having a P-N junction structure.

Figure 4:
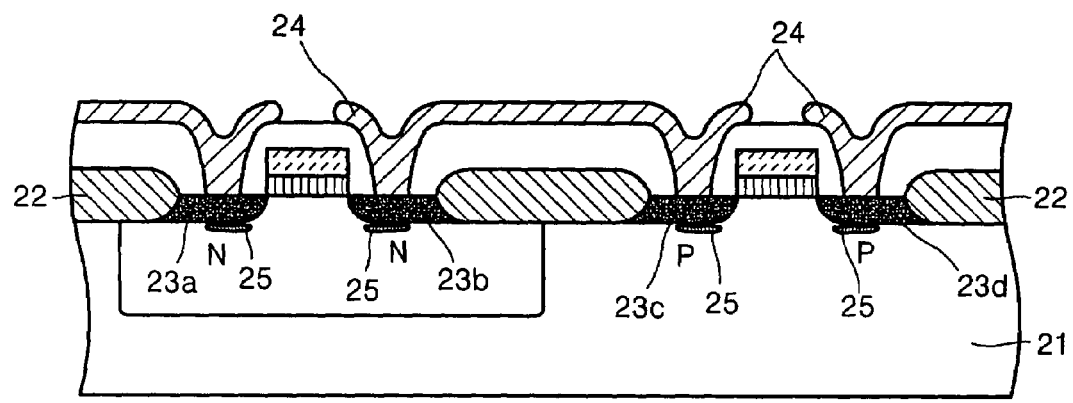
FIG. 4 is a view of a complementary metal oxide semiconductor (CMOS) device where a contact structure according to an embodiment of the present invention is applied.

FIG. 4 is a sectional view of a CMOS device where a contact structure according to an embodiment of the present invention is applied.

A CMOS device comprises an NMOS and a PMOS. A gate of the NMOS is connected to a gate of the PMOS. The gates of the NMOS and PMOS function as an input terminal, and a junction portion of drains of the PMOS and NMOS functions as an output terminal.

As shown in FIG. 4, the insulation doping layer 25 is implanted under n-type source and drain regions 23a and 23b and p-type source and drain regions 23c and 23d. The conductive layer 24 such as an aluminum layer is formed on the n-type source and drain regions 23a and 23b and the p-type source and drain regions 23c and 23d. That is, the contact structure of the present invention is applied to the n-type source and drain regions 23a and 23b and the p-type source and drain regions 23c and 23d. Particularly, when there is a need to precisely adjust a property of matter of a semiconductor device due to a scaling down, the present invention is more applicable.

That is, the insulation doping layer can be formed by implanting the insulation-forming material such as oxygen and nitrogen after, before or simultaneously with the implantation of the conductivity-forming material in the course of making the CMOS device.

Figure 5:
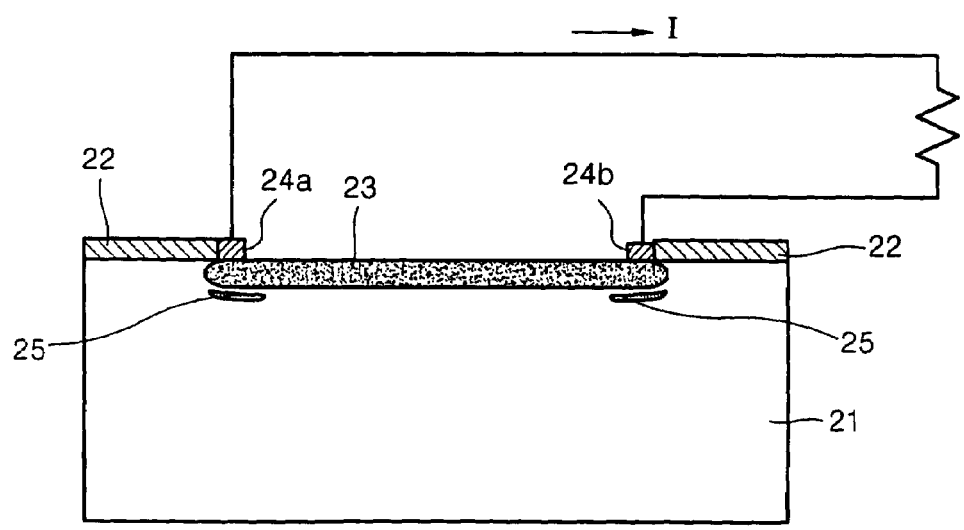
FIG. 5 is a view of a light receiving device where a contact structure of a semiconductor according to an embodiment of the present invention is applied.

FIG. 5 is a view of a silicon light receiving device where a contact structure according to an embodiment of the present invention is applied.

A silicon light receiving device comprises a substrate 21, a conductive doping layer 23 formed in the substrate 21, and first and second electrodes 24a and 24b formed on the substrate 21 and electrically connected to each other. A control layer for allowing the conductive doping layer 23 to be formed with an ultra-shallow thickness may be further formed on the substrate 21. An insulation doping layer 25 is formed under the conductive doping layer 23 in the substrate 25, corresponding to the first and second electrodes 24a and 24b.

According to the present invention, since the semiconductor device having the above-described contact structure is electrically stabilized, a spike phenomenon that may be incurred in the conventional art can be prevented. Even when the spike phenomenon is incurred, it does not seriously affect the operation of a semiconductor device. Therefore, it is possible to realize a semiconductor device that is electrically stable and reliable. In addition, the contact structure according to the present invention can be applied to a variety of semiconductor devices including a p-n junction.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A contact structure of a semiconductor, comprising:
    a substrate;
    a conductive doping layer having an opposite polarity to that of the substrate, the conductive doping layer being formed in the substrate;
    a conductive layer formed on the conductive doping layer; and
    an insulation doping layer formed under the conductive doping layer in the substrate.

2. The contract structure of claim 1, wherein the substrate and the conductive doping layer form a p-n junction.

3. The contact structure of claim 1, wherein the insulation doping layer is formed of oxygen or nitrogen.

4. The contact structure of claim 1, further comprising an insulating layer formed on a portion of the substrate, on which the conductive layer is not formed.

5. The contact structure of claim 1, wherein the conductive layer is formed of metal and the conductive doping layer is formed of conductivity-forming material.

6. A method of making a contact structure of a semiconductor device, comprising:
    forming an insulating layer on a substrate and removing a portion of the insulating layer to expose a portion of the substrate;
    forming a conductive doping layer and an insulation doping layer in the substrate through the exposed portion of the substrate, the insulation doping layer being formed under the conductive doping layer; and
    forming a conductive layer on the conductive doping layer.

7. The method of claim 6, wherein the forming the insulating layer comprises:
    forming an oxide layer on the substrate;
    light-exposing and developing the oxide layer after disposing a mask above the oxide layer; and
    etching a portion of the oxide layer to expose the portion of the substrate.

8. The method of claim 6, wherein the forming the conductive doping layer comprises:
    forming the conductive doping layer by diffusing or implanting conductivity-forming material through the exposed portion of the substrate; and
    forming the insulation doping layer by diffusing or implanting insulating-forming material through the exposed portion of the substrate.

9. The method of claim 8, wherein the insulation-forming material is one of oxygen and nitrogen.

10. The method of claim 6, wherein the forming the conductive doping layer comprises:
    forming the insulation doping layer by diffusing or implanting insulation-forming material through the exposed portion of the substrate; and
    forming the conductive doping layer by diffusing or implanting conductivity-forming material through the exposed portion of the substrate.

11. The method of claim 6, wherein the conductive doping layer and the insulation doping layer are formed by simultaneously doping conductivity-forming material and insulation-forming material.

12. The method of claim 6, wherein the forming the conductive layer comprises:
    depositing the conductive layer on the insulating layer and the exposed portion of the substrate;
    light-exposing and developing the conductive layer after disposing a mask above the conductive layer; and
    etching a portion of the conductive layer.

13. The method of claim 6, further comprising performing a heat-treatment to activate the conductive doping layer.

14. The method of claim 6, comprising forming the insulation doping layer before or after forming the conductive doping layer.

* * * * *